United States Patent [19]

Yakura

[11] Patent Number: 4,510,672

[45] Date of Patent: Apr. 16, 1985

[54] PROCESS FOR MAKING STACKED HIGH VOLTAGE RECTIFIERS

[75] Inventor: John Yakura, Visalia, Calif.

[73] Assignee: California Linear Circuits, Inc., La Mirada, Calif.

[21] Appl. No.: 421,811

[22] Filed: Sep. 23, 1982

[51] Int. Cl.³ .................. H01L 21/225; H01L 21/50; H01L 21/68; H01L 25/08

[52] U.S. Cl. .................. 29/574; 29/576 J; 29/588; 118/232; 148/188; 228/44.7; 357/77; 427/85; 427/429

[58] Field of Search .................. 29/574, 576 J, 588, 29/589; 357/76, 77; 148/186, 187, 188; 427/85, 429, 425; 118/232, 560; 269/254 CS, 296, 903; 228/44.1 R, 44.1 A, 121

[56] References Cited

U.S. PATENT DOCUMENTS

| | | | |
|---|---|---|---|
| 3,069,603 | 12/1962 | Hunter | 29/576 J X |
| 3,183,130 | 5/1965 | Reynolds et al. | 148/188 |
| 3,235,957 | 2/1966 | Horsting | 269/903 X |
| 3,503,125 | 3/1970 | Haberecht | 29/576 J |
| 4,267,212 | 5/1981 | Sakawaki | 427/425 X |

Primary Examiner—Brian E. Hearn
Assistant Examiner—Alan E. Schiavelli
Attorney, Agent, or Firm—Spensley Horn Jubas & Lubitz

[57] ABSTRACT

A process for making stacked high voltage rectifiers includes initially doping a plurality of silicon wafers with paint-on dopants applied with an applicator that is gradually moved from the center to the outer edge of each wafer while the wafer is peripherally supported and rotated sufficiently slowly to prevent spin-off and runover of each dopant onto the reverse side of the wafer. The dopants are driven in by heating in a diffusion furnace. The same slow rotation and moving applicator technique then is used to coat only the N-doped side of the wafer with a paint-on noble metal dopant. The noble metal is driven in using a diffusion furnace at a temperature that is selected in accordance with the measured reverse recovery time of the wafer prior to noble metal diffusion.

The wafers are silver coated and stacked, and a compression jig is used to exert compressive force on the stack while it is heated in a alloying furnace to a temperature sufficiently high to cause "wetting" of the silver. Thereafter the wafer stack is quickly cooled. The compressive force is programmatically varied in accordance with the stack temperature, with maximum pressure being applied as the metal "wetting" temperature is reached.

Ultrasonic grinding then is used to form individual stacked junction dice from the resultant wafer stack. The dice then have leads attached, are etched to remove edge damage, and are encapsulated to form the rectifiers.

6 Claims, 10 Drawing Figures

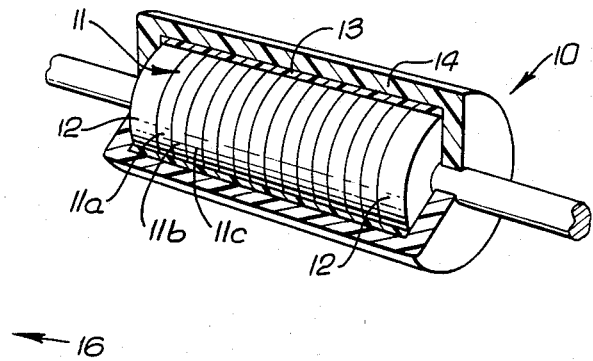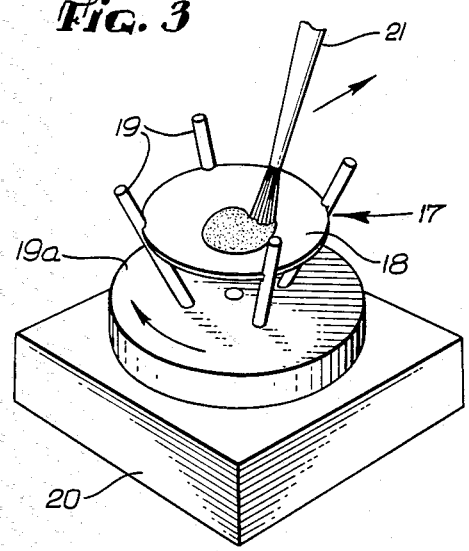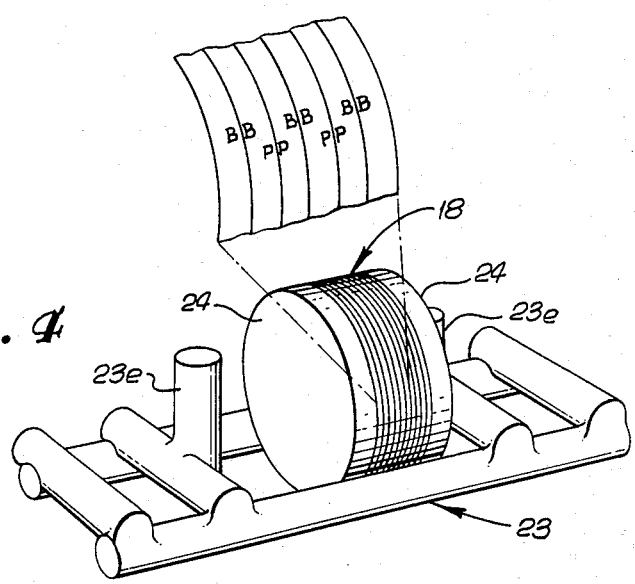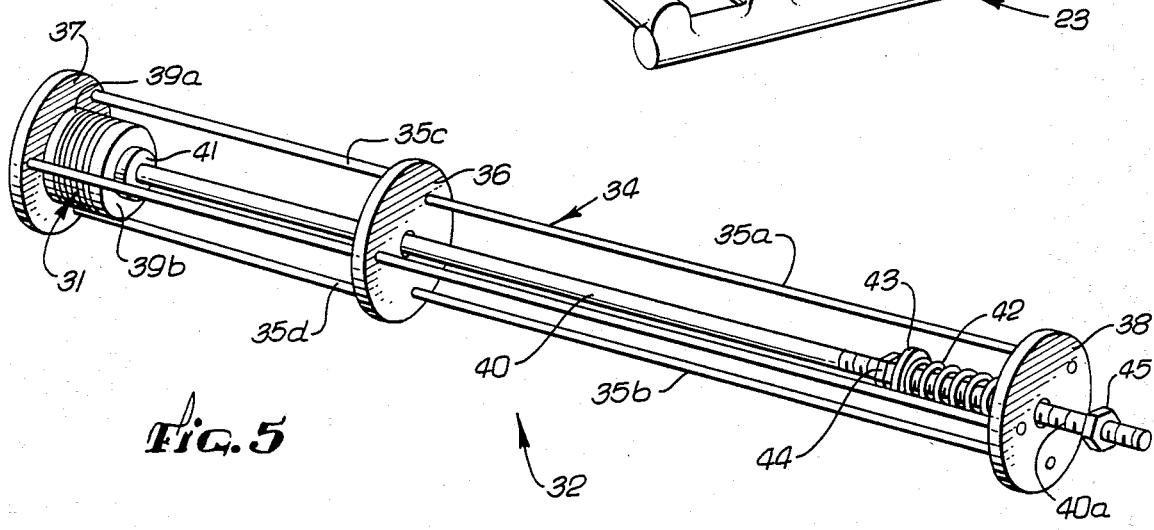

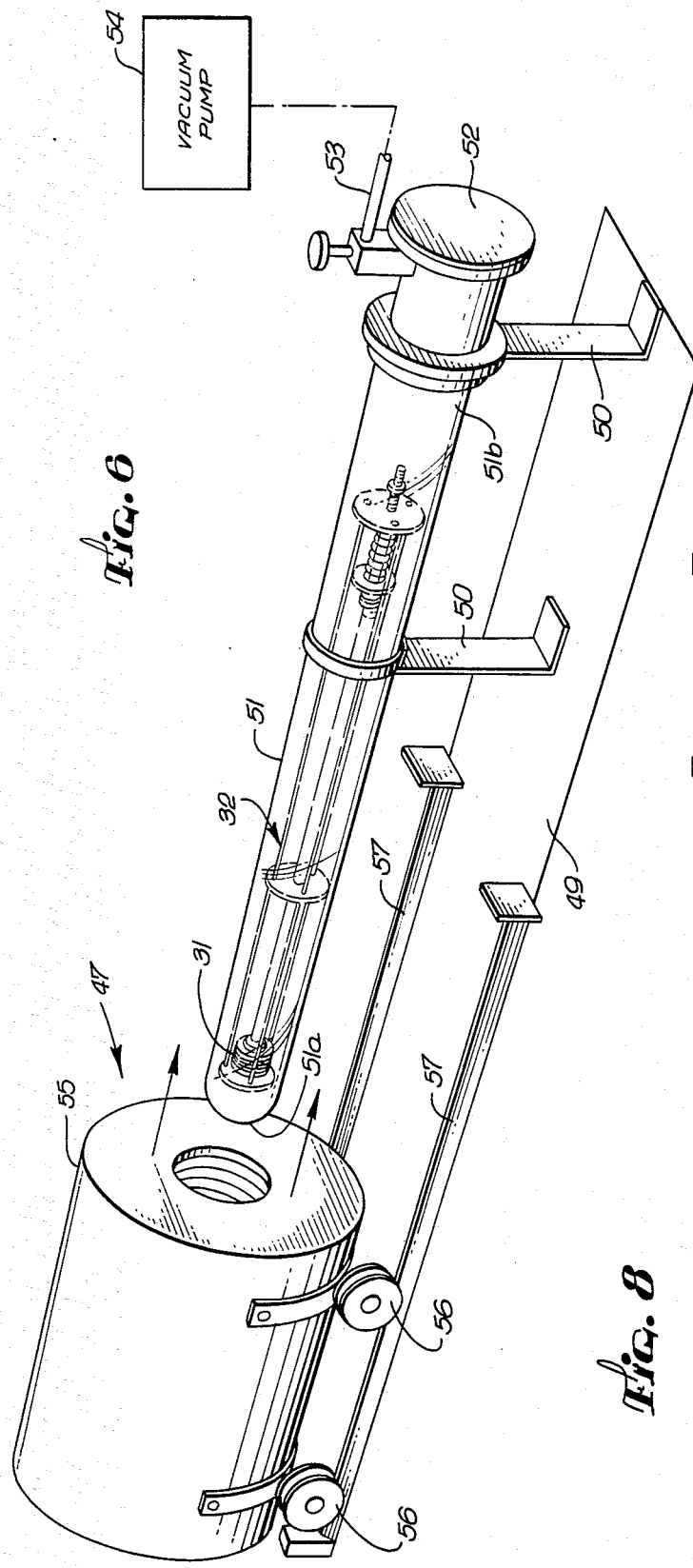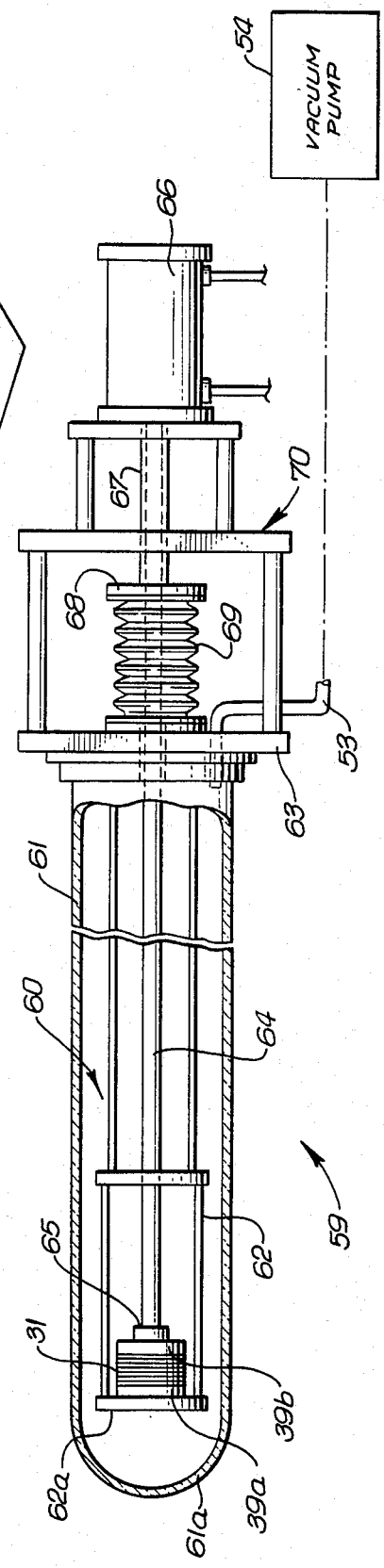

PROCESS FOR MAKING STACKED HIGH VOLTAGE RECTIFIERS

BACKGROUND OF THE INVENTION

1. Field of the Invention

The present invention relates to a process for making stacked high voltage rectifiers of relatively large cross-sectional area.

2. Description of the Prior Art

A typical stacked high voltage rectifier consists of a small plurality of flat semiconductor diodes each having a single p-n junction extending the entire cross-sectional area of the semiconductor. These diodes are stacked and metallurgically bonded together with the p+ region of one diode facing the n+ region of the adjacent diode. Electrical leads are connected to the top and bottom of the stack and the entire device is encapsulated.

Such stacked rectifiers have certain benefits. For example, by using plural series connected diodes, high peak inverse voltage ratings are achieved. However, the current rating of such a stacked rectifier is limited by the cross-sectional area of the stacked diodes. In the past, it has generally not been possible on a production basis to manufacture stacked rectifiers having a cross-sectional area of more than about one sixteenth of an inch. The current handled by a stacked rectifier of this one sixteenth inch area is limited to about 250 milliamps as a maximum.

An objective of the present invention is to provide a process for manufacturing stacked high voltage rectifiers having cross-sectional areas substantially greater than one sixteenth of an inch. Since the current rating of such a stacked rectifier increases by the square of the area, average rectified current values substantially greater than those obtainable in the past can be achieved under production conditions using the inventive process. For example, stacked rectifiers having a cross-sectional area of one-eighth inch, with an average rectified current of up to one ampere, readily may be manufactured using the process disclosed herein.

In the past, a number of problems have limited the effective area of stacked diodes. One such problem involves the formation of the p-n junction in each wafer. Advantageously, the junction itself should extend uniformly over the entire area of each diode element in the stack. Typically, these constituent diode elements comprise dice cut from a silicon wafer in which a single p-n diffused junction has been formed across the entire wafer.

Uniformity of the junction across the entire wafer is imperative to ensure that each die cut from the wafer will itself have a junction that is uniform over the entire die. However, prior art doping technique often resulted in nonuniformity, particularly near the outer periphery of the wafers. If a stacked rectifier included even a single diode whose characteristics differed significantly from the others in the stack, the overall peak inverse voltage or average rectified current ratings would be substantially degraded, and the entire rectifier might have to be discarded. Thus, uniformity of the individual p-n junctions in all of the wafers from which the stacked rectifiers are formed is of considerable importance.

Another objective of the present invention is to provide a technique and apparatus for doping the wafers and forming the p-n junctions in such wafers so as to achieve high uniformity.

Another significant problem in the past involves the metallurgical bonding or interconnection of the stacked diodes. Typically this was done by forming a stack of uncoated diode wafers alternating with flat circular metal (typically silver) interlayers, or by forming a stack a diode wafers each coated with metal. The stack was heated to above the semiconductor (typically silicon) -metal eutectic temperature. Advantageously, this formed a bond between the silicon of one wafer, the metal interlayer and the silicon of the adjacent wafer. The stacked wafers then were diced to form the individual rectifiers.

In this metallurgical bonding step, voids often occurred where an effective bond was not achieved uniformly over the entire surface of the adjacent wafers. Current flow is substantially reduced across the area of such a void.

When the wafer stack is cut into dice, such a void may extend over a substantial portion of one or more of the resultant individual rectifiers. In a rectifier having such a void, the current rating may be very substantially reduced. This is true even though the void occurs in only a single one of the plural metallurgical bonds between the many diode elements of the stack. Of course, if voids should occur in the metallurgical bonds between more than one pair of the diodes in a stack, the current rating may be even further reduced.

Thus the occurrence of even small voids in the metallurgical bonds may substantially reduce the yield or number of acceptable stacked rectifiers that are produced from a particular stack of wafers. Another objective of the present invention is to provide a technique for metallurgically bonding a stack of diode wafers in a manner that is substantially free of voids. A further objective is to provide appropriate jig and furnace apparatus for accomplishing such substantially void-free metallurgical bonding of stacked wafers.

Yet another objective is to provide an overall process for making large area stacked high voltage rectifier in which each of the process steps is compatible with all of the others.

SUMMARY OF THE INVENTION

These and other objectives are achieved by the inventive process for making large are stacked high voltage diodes.

To accomplish uniform doping of each wafer without edge runover, a liquid dopant is used. The wafer is rotated slowly, typically at less than about twenty revolutions per minute, while the dopant is brushed on. The brush itself is moved slowly from the center of the wafer out to the edge. Use of the slow rotation minimizes runover of the dopant to the other side of the wafer. An apparatus is disclosed for holding and rotating the wafers during such dopant application.

Advantageously, each wafer is coated with a phosphorous dopant on one side and a boron dopant on the other. The coated wafers are coin stacked with sides of like dopant facing one another. A deep diffusion is carried out resulting in a relatively abrupt p-n junction across the entire area of each wafer.

Next, using the same slow rotation and brush-on technique, a liquid platinum dopant is coated on the phosphorous side only of each wafer. This is diffused and driven in with a furnace at a temperature dependent on the measured reverse recovery time of the diode wafer being treated. The platinum dopant reduces the lifetime of the wafer and aids in achieving a fast reverse recovery time for the resultant stacked rectifier.

To accomplish a uniform, substantially void-free metallurgical bond between wafers in a stack, each wafer first is covered on both sides with vapor deposited silver. The wafers are stacked and held in a special compression jig. This jig maintains a substantial pressure on the wafer stack while it is heated to a temperature above the metal-semiconductor (typically, silver-silicon) eutectic temperature. The compression is maintained until the temperature is sufficiently high so as to cause "wetting" and flow of the metal. When this wetting temperature is achieved, the heating quickly is discontinued, and the compression may be terminated.

In one embodiment, the compression jig consists of a rigid holder against one end of which the stack of wafers is mounted. Extending from the other end of the holder is a movable rod terminating in a pressure plate that exerts a compressive force against the stack of wafers. This rod is biased toward the wafer stack by a spring that is compressed by an amount adjusted to create the desired compressive force on the wafer stack.

Advantageously, the heating of the wafer stack is carried out in a vacuum alloy furnace. Alternatively, the alloying could be accomplished in an inert atmosphere. In either instance, the compression jig maintains a pressurizing force on the stack of wafers while the stack is in the alloy furnace.

In one embodiment, a "rolling" furnace is used. The compression jig with the stack of wafers mounted thereon is placed within a closed glass heating tube. The heating tube is evacuated. The furnace itself is generally annular in shape and mounted on rollers so that it can be rolled into surrounding engagement with the portion of the evaporated heating tube that contains the compressed stack of wafers.

The temperature in the heating tube is monitored. When the temperature reaches the wetting temperature of the metal, so that the heat-up curve of the wafer stack begins to flatten out, the furnace is rolled away from the heating tube. This quickly terminates the heating operation after the metal wetting temperature has been reached. The metal uniformly flows across the entire surface area of each wafer. A uniform eutectic layer is formed between each of the adjacent wafers in the stack, substantially free of voids.

In an alternative embodiment, controllable pressure is exerted on the wafer stack during the heating and cooldown. The amount of pressure is programmatically varied as a function of stack temperature, with peak pressure being applied as the metal wetting temperature is reached.

An ultrasonic impact grinder is used to form dice from the wafer stack. The wafer stack is cemented onto a relatively thick glass sheet, which itself is bonded to an aluminum block. An ultrasonic impact grinder then is used to cut completely through the wafer into the glass. With this mounting arrangement, each die, though severed from the wafer, remains in place on the glass plate. Since the wafer and dies are rigidly held during the ultrasonic impact grinding, minimal fracture or damage of the dice occurs.

When ultrasonic impact grinding is completed, the cement bonding the dice to the glass is dissolved, thereby separating the individual dice.

Metal (advantageously silver) leads are attached to each dice. The resultant structure is etched to remove any edge damage resulting from the dicing, and to eliminate all of the other materials which may be present on the surface of the stacked device as a result of the lead bonding operation. Finally, the stacked high voltage rectifier is passivated and encapsulated.

BRIEF DESCRIPTION OF THE DRAWINGS

A detailed description of the invention will be made with reference to the accompanying drawing wherein:

FIG. 1 is a pictorial view, partly cut away and in section, of a stacked high voltage diode fabricated in accordance with the inventive process.

FIG. 3 is a perspective view of the apparatus used for dopant coating of the wafers in accordance with the present invention.

FIG. 4 is a pictorial view showing the coin stacking of the doped wafers for diffusion.

FIG. 5 is a pictorial view of one embodiment of a compression jig used to exert pressure on a wafer stack during metallurgical bonding thereof.

FIG. 6 is a pictorial view of a rolling furnace used to accomplish metallurgical bonding of a wafer stack while the stack is held under compression.

FIG. 8 is a pictorial view of an alternative pressure jigging arrangement for compressing a wafer stack while in an alloy furnace.

DESCRIPTION OF THE PREFERRED EMBODIMENTS

Figure 2:
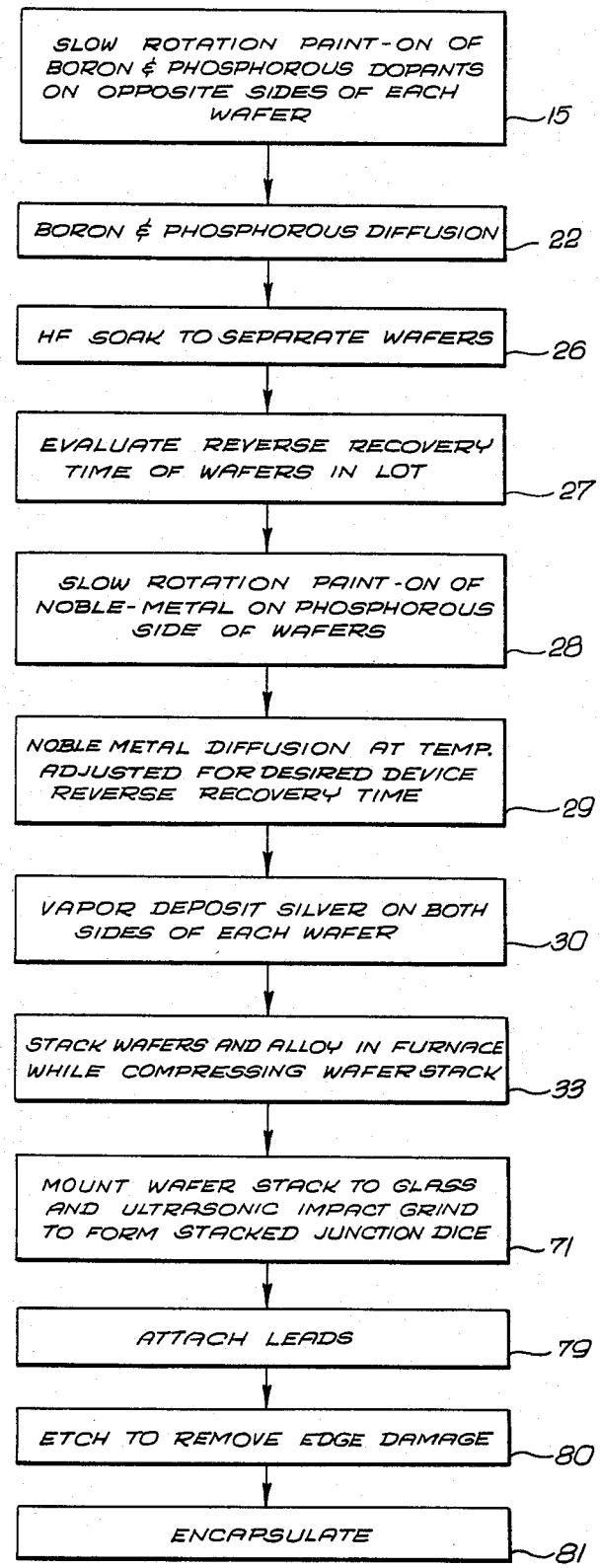
FIG. 2 is a flow chart showing the steps of the inventive process for making stacked high voltage rectifiers.

The following detailed description is of the best presently contemplated mode of carrying out the invention. This description is not to be taken in a limiting sense, but is made merely for the purpose of illustrating the general principle of the invention, since the scope of the invention best is defined by the appended claims.

A typical large area stacked high voltage rectifier 10 made in accordance with the inventive process is shown in FIG. 1. The rectifier 10 consists of a stack 11 of p-n junction chips or diode elements 11a, 11b, 11c . . . that are metallurgically bonded together. Electrical leads 12 are attached to the ends of the stack 11. The entire device is covered with a passivation coating 13 and encapsulated in a plastic body 14.

Advantageously, the stack 11 is circular in cross-section and has a diameter greater than one-sixteenth of an inch. A typical rectifier 10 includes a stack 11 having a diameter of one-eighth inch, with from two to about ten or more individual diode elements. Each such diode element may have a typical peak inverse voltage of about one thousand volts. Therefore, a rectifier 10 having a stack 11 consisting of six diode elements may have a peak inverse voltage rating of about six thousand volts.

Because the cross-sectional area of the stack 11 is relatively large, very high average rectified current can be achieved. For example, a current rating of one ampere is typical for a rectifier 10 having a stack 11 that is one-eighth of an inch in diameter. A reverse recovery time in the order of two milliseconds is typical for such a device.

A flow chart of the process used to make the rectifier 10 is shown in FIG. 2. Initially, an appropriate p-n junction is formed in each of a plurality of device grade silicon wafers. Typically the wafers are about two inches in diameter. To achieve a uniform junction over the entire area of each wafer, a slow rotation dopant paint-on technique (indicated as step 15 of FIG. 2.) is used.

To accomplish this, an apparatus 16 (FIG. 3) is used, which has a wafer support assembly 17. An individual wafer 18 is placed horizontally on a set of oblique, notched, resilient fingers 19 that are part of the assembly 17. The fingers 19 extend obliquely upward and outward from a base 19a that is slowly rotated by a motor 20. The rotation rate advantageously is less than about twenty revolutions per minute, and typically is twelve revolutions per minute.

As the wafer 18 and support assembly 17 are slowly rotating, a dopant brush 21 is used to paint a liquid dopant onto the exposed surface of the wafer 18. The brush 21 is slowly moved from the center to the outside edge of the wafer. The slow rotation of the wafer 18 minimizes spin-off and run-over of the dopant onto the underside of the wafer 18.

Use of the notched fingers 19 to hold the wafer 18 during this operation eliminates another problem of the prior art. In prior art systems, the wafer was placed directly on a rotating platform and held in place by a vacuum drawn through holes in the platform. The flow of air around the edges of the wafer, toward the vacuum holes on the platform beneath the wafer, forced some dopant to run over the wafer edge onto the reverse side. That problem is eliminated by use of the apparatus of FIG. 3.

One side of the wafer 18 first is coated with a dopant of a first conductivity type. For example, a commercially available paint-on dopant material containing phosphorous, with a dopant concentration on the order of $5 \times 10^{20}$ atoms per cubic centimeter may be employed. The slow rotation technique will ensure that none of this phosphorous-containing dopant runs over onto the underside of the wafer 18.

After the phosphorous-containing dopant has dried, the wafer is turned over and again placed on the support assembly 17. The same slow rotation technique is used to coat the obverse side of the wafer 18 with a dopant of opposite conductivity type. For example, a boron-containing material with a dopant concentration of $5 \times 10^{20}$ atoms per cubic centimeter may be used. Once again, the slow rotation technique eliminates run-over of the boron-containing dopant onto the underside of the wafer 18 which is phosphorous coated.

Next (step 22 of FIG. 2), a diffusion heating is carried out to diffuse and drive in the phosphorous and boron dopants into the wafer 18 so as to form a uniform, relatively abrupt p-n junction therein. To carry this out, a plurality of the dopant coated wafers 18 are coin stacked with similarly doped sides facing each other, as illustrated in FIG. 4.

The wafers 18 are stacked on a conventional "boat" or holder 23. They are situated vertically in a tightly packed array. Quartz spacers 24 are used between the ends of the wafer 18 stack and the end members 23e of the boat 23. This tight packing also aids in keeping any paint-on dopant of one type (e.g., boron) from going over to the opposite side of the wafer (e.g., containing the phosphorous dopant). The tight packing also helps to achieve uniform diffusion and doping level in the wafers themselves. In FIG. 4 the symbols B and P indicate the dopant coating (boron or phosphorous respectively) of the coin stacked wafers.

The boat 23 containing the coin stacked wafers is placed in a diffusion furnace. Typically, the diffusion is carried out at a temperature of 1240° C. for a period of seventy-two hours with a flow-through of nitrogen and oxygen gasses. This achieves a uniform deep diffusion of both the boron and phosphorous.

In a typical embodiment, each wafer 18 may have a thickness on the order of 9.5 mils. After the diffusion and drive-in, the wafer 18 will have a phosphorous doped N+ layer typically extending about three mils into the wafer. Extending into the wafer from the opposite surface will be a boron doped P+ layer also about three mils deep, with a concentration slightly less than that of the phosphorous doped region. Between the P+ and N+ regions is a region of intrinsic N− silicon. This arrangement acts as a relatively abrupt diffused p-n junction. Typical sheet resistance at the surface is in the order of 0.8 to 1 ohms per square.

The boat 23 is removed from the furnace and the wafer stack is subjected to a soak in hydrofluoric acid. During this diffusion, a glass typically forms between the adjacent, tightly packed wafers. This will hold the stack together when removed from the furnace. The hydrofluoric acid soak (step 26, FIG. 2) slowly dissolves the glass that is holding the wafers together after the diffusion. The resultant separate wafers, each now containing a diode junction extending over the entire wafer, are subjected to a surface cleaning in hydrofluoric and nitric acid. The reverse recovery time of one such wafer, or of a stack of such wafers, then is measured (step 27, FIG. 2).

To reduce the lifetime of the wafer, and thereby to achieve a device having a fast reverse recovery time, platinum or other noble metal is diffused into the N+ side of each wafer 18. This is accomplished using a liquid dopant containing platinum or other noble metal that is applied using the same slow rotation paint-on technique described above in connection with FIG. 3. The wafer 18 is placed on the support assembly 17 with the N+ (phosphorous doped) side facing upward. Again, the assembly 17 is rotated slowly, typically at about twelve revolutions per minute, while the noble metal liquid dopant is painted on with a brush 21. Again, the brush 21 is moved from the center to the outside edge of the wafer 18.

The doped wafers then are placed in a diffusion furnace and heated to a temperature which is dependent on the reverse recovery time that was measured prior to the diffusion (step 29, FIG. 2). In general, the slower the initially measured reverse recovery time, then the higher will be the temperature used for the diffusion.

Typically, the reverse recovery time evaluated at step 27 will be in the order of from about one millisecond to about three milliseconds. If measured at about one millisecond, a typical platinum diffusion temperature may be approximately 870° C., whereas for an intially measured reverse recovery time of three milliseconds, a diffusion temperature of about 910° C. may be used. The use of the different temperatures, as a function of initially measured reverse recovery time, achieves an essentially uniform reverse recovery time of the finished product. For example, if a relatively slow (typically three milliseconds) reverse recovery time is initially measured, the higher diffusion temperature will cause a greater diffusion and drive-in of the platinum. This will more reduce the lifetime of the wafer, therefore speeding up the reverse recovery time of the device.

Typically the platinum diffusion is carried out for approximately two hours. Advantageously, the diffusion furnace is preheated to the desired temperature before the doped wafers are inserted. This ensures a quick rise time of the temperature of the wafers. Similarly, at the end of the diffusion time, the wafers are quickly removed from the furnace while the furnace is still at the diffusion temperature. This results in a quick fall time of the temperature of the wafers. The quick rise and quick fall in the temperature of the wafers appears to improve the uniformity of the resultant platinum-doped p-n junctions.

Next, metallurgical bonding of a stack of the junction-containing wafers 18 is accomplished using the compression technique of the present invention. Initially, a metal (advantageously silver) is vapor-deposited onto both sides of each wafer (step 30, FIG. 2). The metal coated wafers then are stacked with opposite junction sides facing one another. In other words, the N+ diffused junction surface of one wafer faces the P+ junction surface of the adjacent wafer. This wafer stack 31, with the vapor-deposited metal on each surface of each wafer, is placed in a special compression jig such as the jig 32 of FIG. 5. The jig 32 maintains a pressure on the wafer stack 31 during alloying in a vacuum furnace (step 33, FIG. 2).

In the embodiment of FIG. 5, the jig 32 consists of an elongated rigid frame 34 which may be made of rods 35a, 35b, 35c, 35d rigidly attached to a spacer 36 and to opposite end members 37 and 38. The wafer stack 31 is mounted against a thick carbon disc 39a which in turn abuts against the end member 37 of the rigid frame 34.

A movable rod 40 extends through central openings in the spacer 36 and the end member 38. A face plate 41 is affixed to the end of the rod 40 and a second carbon disc 39b is situated between the face plate 41 and the wafer stack 31. In this way, the rod 40 can exert a compressive force on the wafer stack 31 via the face plate 41, the carbon discs 39b and 39a and the frame end member 37.

In the embodiment of FIG. 5, this compressive force is supplied by a bias spring 42 situated between the frame end member 38 and an annular face plate 43 which surrounds the rod 40. The end 40a of the rod 40 is threaded, and a pair of nuts 44 tightened against one another are used to establish the position of the plate 43 along the rod 40. By changing the position of the tightened nuts 44 and plate 43, the extent of compression of the spring 42 may be adjusted. This controls the amount of bias force exerted on the wafer stack 31 by the bias spring 42 acting against the plate 43 and the rod 40. An additional nut 45 outside of the end member 38 limits the travel of the rod 40.

During the alloy heating of the wafer stack 31, the change in thickness of the stack resulting from melting of the metal between the wafers is minimal, typically on the order of a few thousandths of an inch. Therefore if a relatively sizable compression spring 42 is used, the amount of pressure exerted by the spring against the wafer stack will remain substantially constant throughout the entire alloying period. A typical pressure which is formed to be advantageous is in the approximate range of from 150 to 200 pounds.

The alloying itself advantageously is accomplished by using a rolling furnace 47 such as that shown in FIG. 6. Such a furnace allows rapid removal of the heat from the wafer stack 31 as soon as a temperature has been reached at which the metal smoothly "wets" the entire intersurface between each wafer pair.

In this regard, it has been found that most uniform metallic bonding between the adjacent wafers of the stack 31, with minimum void formation, is accomplished by heating the wafer stack to a temperature somewhat above the metal-semiconductor eutectic temperature. Advantageously, the temperature is raised to a point at which the metal "wets" or flows like solder. When this temperature has been reached, the heating can be rapidly discontinued and the pressure removed from the wafer stack 31.

For the embodiment in which the wafers 18 are silicon and the metal is silver, the silicon-silver eutectic temperature is about 830° C. However, it has been found that by heating such a wafer stack 31 to a temperature of about 910° C., the silver will flow properly and uniformly over the entire are between each of the wafers 18. Heating to this temperature at which the silver "wets" the entire wafer surface, and thereafter quickly removing the heat, has been found to produce a wafer stack that is essentially free of metal voids between the semiconductor layers.

Figure 7:
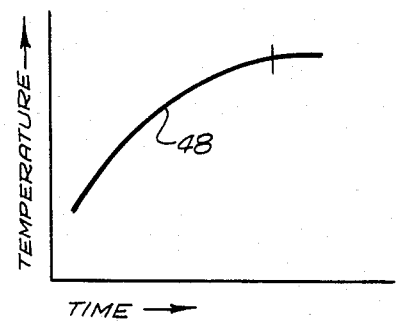
FIG. 7 is a graph showing wafer stack temperature as a function of time in the alloying furnace.

The graph of FIG. 7 shows a typical heating curve for the wafer stack 31. When the wafer stack is placed in the alloy oven, temperature gradually rises along the curve 48. It has been found that the best time to discontinue heating of the wafer stack 31 is when the heating curve 48 just begins to flatten out. When using the rolling furnace 47 of FIG. 6, this occurs at a temperature on the order of 910° C. after a heating time of about seventeen minutes.

Details of the rolling furnace 47 are shown in FIG. 6. The furnace includes a support frame 49 having a pair of holders 50 that horizontally support a quartz furnace tube 51. The furnace tube is closed at one end 51a and is of sufficient diameter to receive the entire compression jig 32 (FIG. 5) in its interior, as shown in FIG. 6. The jig 32 is inserted through the end 51b of the furnace tube 51 with the compressed wafer stack 31 situated toward the closed end 51a.

The furnace tube end 51b is closed by a header 52 which includes a vacuum port connected by a hose 53 to a vacuum pump 54. This arrangement is used to evacuate the interior of the furnace tube to a vacuum typically on the order of five microns.

The furnace 47 also includes a generally cylindrical furnace element 55 mounted on rollers 56 that roll along rails 57 that are attached to the support frame 49. Advantageously, the furnace element 55 includes a cylindrical heater (hidden in FIG. 6) which surrounds the wafer stack 31 when the furnace element 55 is rolled (toward the right as viewed in FIG. 6) into surrounding engagement with the furnace tube 51.

Heating of the wafer stack 31 begins when the furnace element 55 is rolled into position around the furnace tube 51. When the desired temperature in the wafer stack 31 has been reached, the furnace element 55 is rolled away (to the left in FIG. 6) from the furnace tube 51, thereby terminating the heating. As discussed above, this roll-away of the furnace element 55 may be accomplished when the desired metal wetting temperature (approximately 910° C. for silver and silicon) is reached, or when the graph of temperature versus time (FIG. 7) begins to flatten.

An alternative arrangement for maintaining compression on the wafer stack 31 while in the furnace 47 is shown in FIG. 8. In this embodiment, a unitary assembly 59 includes both a compression jig 60 and a furnace tube 61.

The jig 60 includes an elongated rigid frame 62 extending within the furnace tube 61 from a rigid end plate 63. The tube 61 is removably attached to the plate 63. At the other end of the frame 62, adjacent the furnace tube closed end 61a, is an end member 62a against which is mounted the wafer stack 31 and a pair of carbon discs 39a, 39b. A movable rod 64 extends the length of the frame 62 and includes a face plate 65 which exerts pressure against the wafer stack 31.

The source of this pressure is a pneumatic cylinder 66. The associated pneumatic piston or air ram 67 is attached to the rod 64 (which itself extends through a central opening in the plate 63) and to a movable plate 68 arranged in spaced parallel relationship with the rigid end plate 63. A set of bellows 69 connects the end plates 63 and 68, and permits limited movement of the plate 68, rod 64 and face plate 65 when the cylinder 66 is actuated, thereby exerting force via the rod 64 on the wafer stack 31. A frame 70 mounted to the plate 63 supports the air cylinder 66. The vacuum pump 54 and line 53 are connected through a port in the end plate 63 to facilitate evacuation of the interior of the assembly 59.

For heating, a rolling furnace element, like that shown in FIG. 6, is rolled over the closed end of the unitary assembly 59 so as to heat the wafer stack 31. During the heating process, pressure provided by the cylinder 66 maintains the wafer stack 31 in a compressed state. When the desired wetting condition of the metal in the wafer stack has been achieved, the pressure exerted by the cylinder 66 may be released. Heating is terminated as before by rolling back the furnace element 55 away from the furnace tube 61.

Alternatively, the assembly of FIG. 8, without the tube 61, line 53 and pump 54, may be inserted into the assembly of FIG. 6, in place of the jig 32. In that case, the plate 63 would replace the end plate 52.

Figure 9:
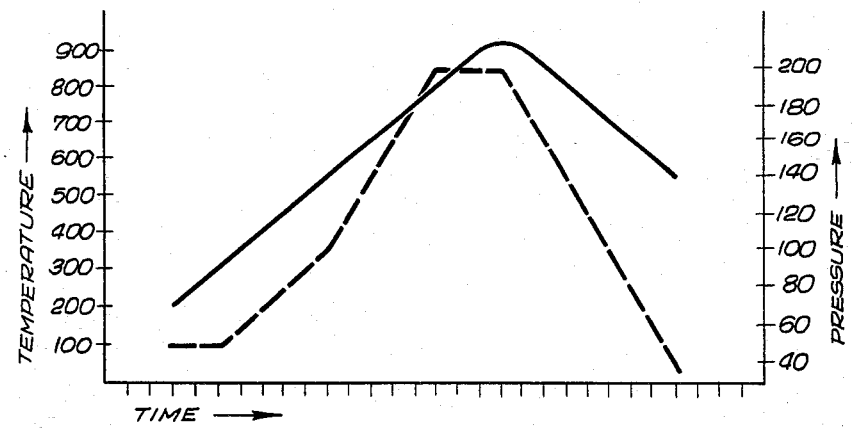
FIG. 9 is a graph of pressure exerted by the apparatus of FIG. 8 in accordance with the temperature of the wafer stack.

Advantageously, the pressure exerted on the wafer stack 31 may be programmatically varied in accordance with the stack temperature during the alloy heating. The graph of FIG. 9 shows the preferred relationship, in which the applied pressure is increased as the wafer stack is heated to the metal wetting temperature. This increasing pressure promotes smooth, even flow of the wetted metal over the entire interwafer surface, thereby forming an alloy interface that is substantially free of voids. As the temperature thereafter is decreased, the pressure is concomitantly reduced.

Figure 10:
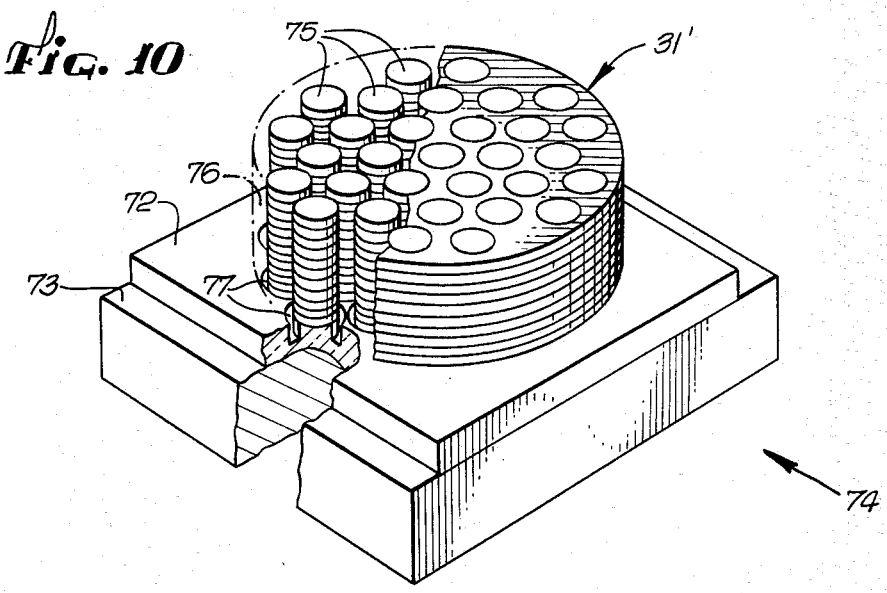
FIG. 10 is a pictorial view of an alloyed wafer stack mounted in accordance with the present invention for dicing using an ultrasonic impact grinder.

After the alloying step 33 (FIG. 2) is completed, the wafer stack 31 is removed from the compression jig 32 or 60 and prepared for dicing. In the dicing operation (step 71, FIG. 2) ultrasonic impact grinding is used to cut out individual stacked junction dice from the wafer stack 31. Advantageously this is accomplished with the alloyed wafer stack 31' mounted as shown in FIG. 10.

Referring thereto, the alloyed wafer stack 31' itself is cemented to a relatively thick glass plate 72 which in turn is cemented to a metal (typically aluminum) block 73. This entire assembly 74 then is placed beneath an ultrasonic impact grinder, the head of which is configured simultaneously to cut the wafer stack 31' into a plurality of spaced parallel stacked junction dice 75 (illustrated in the cutaway left hand portion of FIG. 10).

During this dicing operation, the impact grinder ultrasonically carves away the material in the wafer stack 31' between the resultantly formed circular or rod shaped dice 75. The depth of ultrasonic cutting is adjusted to be greater than the height of the wafer stack 31'. Thus the grinder will also erode away a portion 77 of the glass plate 72, directly beneath the eroded portion 76 of the stack 31'. Advantageously grinding is halted before any erosion of the metal block 73 occurs. The cement used to hold the stack 31' to the glass plate 72 maintains all of the dice 75 in place during and after the entire ultrasonic impact grinding operation. As a result, the dice 75 are cleanly formed, with fracturing and edge damage being held to a minimum. When the grinding operation is completed, the cement is dissolved in alcohol or other solvent to separate the dice 75 from the glass support plate 72.

Next (step 79, FIG. 2) metal leads 12 (FIG. 1) are attached to each end of the individual dies 75 (which correspond to the multiple junction stack 11 in the completed rectifier 10 of FIG. 1). Advantageously, but not necessarily, silver is used for the leads 12. While relatively high in cost, silver not only has good electrical conductivity, but also has good thermal conductivity. It therefore can effectively act as a heat sink for the finished rectifier device.

Advantageously the silver leads are attached to the ends of the dice 75 by soldering. This may be carried out in a conventional belt furnace at a temperature on the order of 300° C.

After lead attachment, the device is etched to remove any edge damage resulting from the dicing, and to remove residual chemicals from the lead attachment step. This etching (step 80, FIG. 2) may be carried out by sequentially submersing the die 75 and attached leads 12 first in a 2:1 hydrofluoric acid-nitric acid bath, followed by etching in acetic acid, then nitric acid, then ammonium hydroxide. This combination of etchants has been found effective in removing edge damage and in dissolving other materials which might be present from the prior processing steps.

Finally, the device is passivated and encapsulated (step 81, FIG. 2). The passivation may comprise coating the junction area of the die 75 with a silicone varnish. Typically the varnish is cured at about 220° C. for a period of two days. This forms the passivation coating 13 shown in FIG. 1.

Thereafter, the entire assembly is encapsulated with a thermosetting plastic to form the body 14. This completes fabrication of the high voltage multiple junction rectifier 10.

I claim:

1. In a process for making stacked high voltage rectifiers, the improvement comprising:
   coating each of a plurality of silicon wafers with paint-on P-type and N-type dopants respectively on opposite sides of each wafer, said coating being carried out by:
   slowly rotating the wafer at a speed of less than about twenty revolutions per minute while said wafer is supported at its edge, in a horizontal plane, by a set of radially widely spaced support fingers,
   applying one of said dopants with an applicator that is gradually moved from the center to the outer edge of one side of said wafer while said wafer is being slowly rotated, repeating said slowly rotating and applying steps with the wafer inverted, for applying the other of said dopants to the opposite side of said wafer, said slow rotation limiting spin-off and runover of each dopant onto the reverse side of said wafer, and thereafter tightly coin stacking a plurality of wafers, each coated in accordance with the preceding steps, with similarly doped sides facing each other, and diffusing said wafers by heating said tightly coin stacked wafers in a diffusion furnace.

2. In a process for making stacked high voltage rectifiers, the improvement for alloying together a stack of semiconductor wafers each doped on opposite sides with respective opposite conductivity dopants, comprising:

providing a metal layer on at least one side of each doped wafer, coin stacking a plurality of said metal layer provided wafers with doped sides of opposite conductivity facing each other, there being at least one metal layer between each pair of wafers, mounting said stacked wafers in a compression jig, said jig exerting a compressive force on said stack of wafers, heating said stacked wafers while in said compression jig to a temperature sufficient to cause wetting of the metal while maintaining compression of said stack with said jig, and quickly discontinuing said heating and reducing the compressive force on said stacked wafers when said wetting temperature has been reached, and wherein said heating is carried out in a rolling furnace, the furnace being rolled into heating engagement with said stacked wafers to initiate heating while said stacked wafers are in said compression jig, said furnace being quickly rolled away from said stacked wafers and compression jig once said wetting temperature has been reached.

3. A process according to claim 2 wherein said heating is carried out in a vacuum or in an inert atmosphere.

4. A process according to claim 2 wherein said semiconductor is silicon, wherein said metal layer is vapor deposited silver, and wherein said heating is to a wetting temperature that is above the silicon-silver eutectic temperature.

5. A process according to claim 2 wherein said compression is maintained substantially constant by said jig throughout said heating.

6. A process for making stacked high voltage rectifiers, comprising the steps of:

coating each of a plurality of silicon wafers with paint-on P-type and N-type dopants respectively on opposite sides of each wafer, said coating being carried out on each side of said wafer by applying the respective dopant with an applicator that is gradually moved from the center to the outer edge of said wafer side while said wafer is horizontally, peripherally supported by spaced support fingers and slowly rotated at a speed of less than about twenty revolutions per minute, diffusing said wafers by heating in a diffusion furnace a tightly coin stacked plurality of wafers, each coated in accordance with the preceding step and arranged with similarly doped sides facing each other, separating said diffused wafers and evaluating the reverse recovery time thereof, coating the N-type doped side of each wafer with a paint-on noble metal dopant applied with an applicator that is gradually moved from the center to the outer edge of said N-type doped side of said wafer while said wafer is slowly rotated at a speed of less than about twenty revolutions per minute, diffusing and driving in said noble metal in a diffusion furnace at a temperature adjusted in accordance with the measured and desired reverse recovery times of said wafer, vapor depositing silver on both sides of each wafer, heating a coin stacked plurality of said silver coated wafers in a vacuum or inert atmosphere furnace while maintaining said wafer stack under a compressive force exerted by a compression jig, said stack being heated to a temperature, above the silicon-silver eutectic temperature, at which the silver wets and flows smoothly, and thereafter quickly discontinuing said heating, said compressive force being programmatically varied in accordance with the temperature of said stack, forming individual stacked junction dice from said wafer stack, attaching leads to each die, etching each die and attached leads to remove edge damage thereof, and encapsulating the resultant product to form said stacked high voltage rectifier.

* * * * *